United States Patent
Yang et al.

(10) Patent No.: US 6,824,617 B2
(45) Date of Patent: Nov. 30, 2004

(54) INPUT/OUTPUT VALVE SWITCHING APPARATUS OF SEMICONDUCTOR MANUFACTURING SYSTEM

(75) Inventors: Yun-Sik Yang, Suwon (KR); Jin-Man Kim, Seoul (KR); Young-Min Min, Suwon (KR); Chang-Hyun Jo, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 61 days.

(21) Appl. No.: 10/131,239

(22) Filed: Apr. 25, 2002

(65) Prior Publication Data

US 2003/0010450 A1 Jan. 16, 2003

(30) Foreign Application Priority Data

Jul. 12, 2001 (KR) ........................................ 2001-41917

(51) Int. Cl.[7] .................... C23C 16/00; C23F 1/00; H01L 21/306; B65G 49/07
(52) U.S. Cl. ............. 118/719; 156/345.31; 156/345.32; 204/298.25; 204/298.35; 414/221; 414/939; 118/733
(58) Field of Search ............................ 137/505.12, 513, 137/612–614; 251/118; 118/719; 156/345.31, 345.32; 414/939; 261/DIG. 38

(56) References Cited

U.S. PATENT DOCUMENTS

| | | | | |
|---|---|---|---|---|
| 4,390,188 A | * | 6/1983 | Rouse ...................... 280/6.159 |
| 4,697,613 A | * | 10/1987 | Wienck ...................... 137/171 |
| 4,701,251 A | * | 10/1987 | Beardow ................ 204/298.25 |
| 4,785,962 A | * | 11/1988 | Toshima ...................... 220/260 |
| 4,790,921 A | * | 12/1988 | Bloomquist et al. .... 204/192.12 |
| 5,568,974 A | * | 10/1996 | Plocus et al. ............. 366/151.1 |
| 6,120,606 A | * | 9/2000 | Peng .......................... 118/719 |

FOREIGN PATENT DOCUMENTS

| | | | | | |
|---|---|---|---|---|---|
| JP | 60129405 A | * | 7/1985 | ........... | F16B/11/16 |
| JP | 06035543 A | * | 2/1994 | ............ | G05D/7/06 |
| JP | 11153235 A | * | 6/1999 | ............. | F16K/1/52 |

* cited by examiner

*Primary Examiner*—Parviz Hassanzadeh
*Assistant Examiner*—Karla Moore
(74) *Attorney, Agent, or Firm*—Volentine Francos & Whitt, PLLC

(57) ABSTRACT

An input/output valve switching apparatus of a semiconductor manufacturing system minimizes a vibration set up while operating an input/output valve for opening and closing a wafer-transfer passage that connects chambers of the system. The switching apparatus includes a valve actuator having a close port and an open port, a first fluid line connected to the close port, a second fluid line connected to the open port, first flow regulators installed in the first and second fluid lines, respectively, to regulate the flow rate of fluid, and second fluid flow regulators installed in the first and second fluid lines to regulate the flow rate of the fluid that has passed. The second fluid flow regulators can prevent a rapid introduction of the fluid into the actuator.

17 Claims, 3 Drawing Sheets

INPUT/OUTPUT VALVE SWITCHING APPARATUS OF SEMICONDUCTOR MANUFACTURING SYSTEM

BACKGROUND OF THE INVENTION

1. Field of the Invention

The present invention relates to a semiconductor manufacturing system. More particularly, the present invention relates to switching apparatus that opens and closes a valve disposed in a wafer-transfer passage located between chambers of the semiconductor manufacturing system.

2. Description of the Related Art

Most semiconductor manufacturing systems have a number of sealed chambers so that predetermined processes can be performed in a high vacuum ambient. The chambers include a plurality of process chambers for performing a predetermined process in a high vacuum state, a load-lock chamber for temporarily receiving a wafer before the wafer is transferred into one of the process chambers, and a transfer chamber used for transferring the wafer between the various chambers of the system. More specifically, the transfer chamber is connected to each of the load-lock and process chambers so that the wafer can be transferred between the load-lock chamber and one of the process chambers or between various ones of the process chambers.

A respective input/output valve (I/O valve) is interposed between the transfer chamber and each of the process chambers, and between the transfer chamber and the load-lock chamber.

Such a conventional I/O valve 12, and a switching apparatus 14 comprising an actuator 16 for opening and closing the valve 12, are illustrated in FIG. 1. In the conventional system, the I/O valve 12 cannot maintain a stable driving speed during operation because of a lack of control of the pressure and flow rate of fluid provided to the actuator 16 for driving the I/O valve 12. As a result, a vibration is set up in the system. The vibration of the system causes particles in the process chamber(s) to become unstable which, in turn, results in processing errors.

SUMMARY OF THE INVENTION

In view of the foregoing, the primary object of the invention is to provide an apparatus for smoothly driving an actuator of an input/output valve (I/O valve). Another object of the present invention is to provide a semiconductor manufacturing system which vibrates to a minimum extent when a wafer-transfer passage, that connects vacuum chambers thereof, is opened or closed.

The present invention is characterized by two fluid flow regulators that are disposed in series in an fluid line of the actuator of the I/O valve in order to regulate the flow rate of fluid into the actuator.

According to an aspect of the present invention, the fluid-driven actuator of the I/O valve has a close port and an open port, a first fluid line is connected to the close port, a second fluid line is connected to the open port, a first fluid flow regulator is disposed in each of the first and second fluid lines to regulate the flow rate of fluid, and a second fluid flow regulator is disposed in each of the first and second fluid lines to regulate the flow rate of the fluid that has passed the first fluid flow regulators.

In the preferred embodiment of the invention, each of the first and second fluid flow regulators may be a manually adjustable needle valve that allows the flow rate of the fluid to be regulated by hand. The actuator may be a double-acting pneumatic cylinder. In any case, the rate at which the I/O valve is driven is stabilized due to the fluid flow regulators. Thus, vibrations in the system are minimized to prevent particles from being shaken off into the atmosphere within a process chamber(s).

BRIEF DESCRIPTION OF THE DRAWINGS

These and other objects, features and advantages of the present invention will be better understood from the following detailed description thereof made with reference to the accompanying drawings, of which.

DETAILED DESCRIPTION OF THE PREFERRED EMBODIMENT

Figure 1:
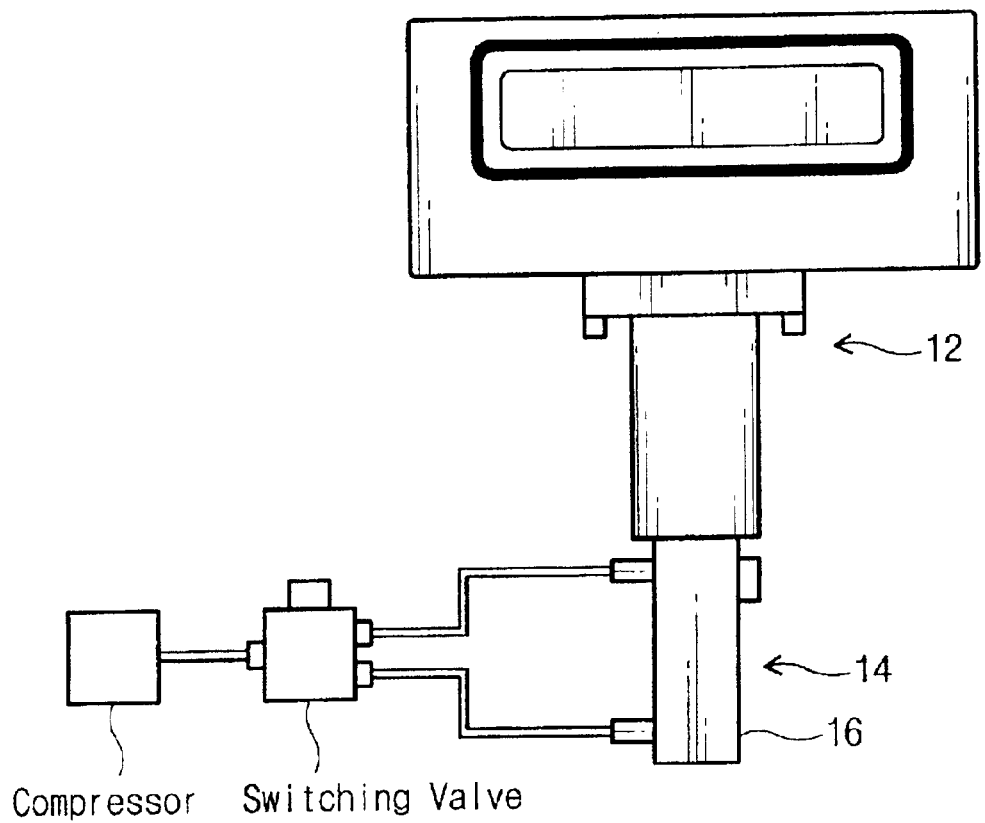
FIG. 1 is a schematic diagram of a conventional input/output valve switching apparatus.
Figure 2:
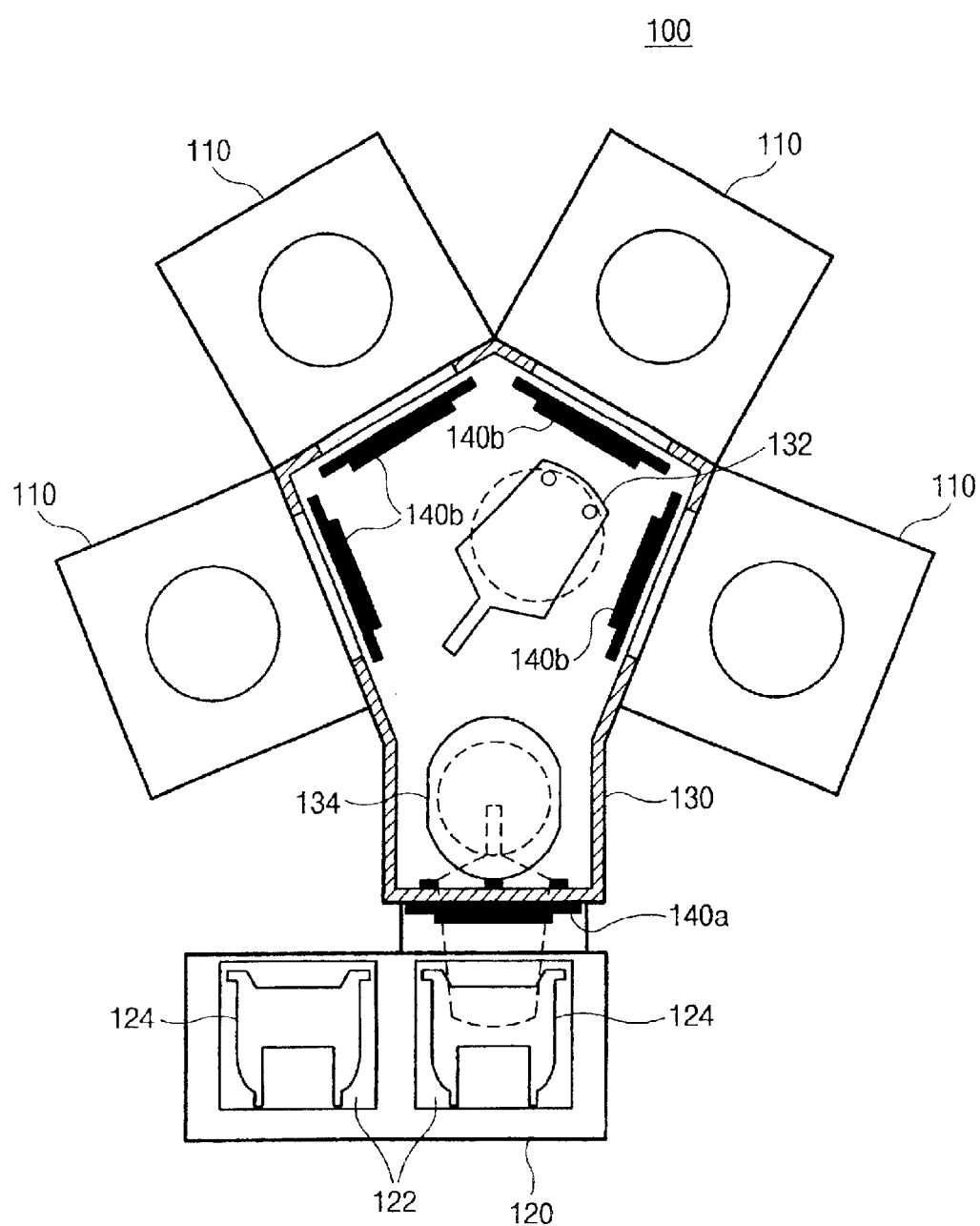
FIG. 2 is a plan view of a semiconductor manufacturing system to which the present invention can be applied.

The present invention is applicable to a semiconductor manufacturing system 100 as illustrated in FIG. 2. The semiconductor manufacturing system 100 is equipped with a plurality of process chambers 110 for performing a predetermined process in a high vacuum ambient, a load-lock chamber 120 for temporarily receiving a wafer before the wafer is loaded into a process chamber 110, and a transfer chamber 130 used to load/unload the wafer into/from the load-lock chamber 120 or the process chamber 110. To this end, the transfer chamber 130 is connected to each of the load-lock and process chambers.

Each of the chambers 110, 120, and 130 has an intrinsic function. Each process chamber 110 is completely isolated from the outside so that a wafer may be processed, e.g., coated by a deposition process or etched, therein. The transfer chamber 130 and the load-lock chamber 120 are configured to ensure that the process chambers 110 remain isolated from the outside so that the process chambers 110 can function as desired. Whenever the process chamber 110 is evacuated to create a high vacuum state therein necessary for processing a wafer, a vacuum pump must be driven for a long period of time while the wafer waits outside the chamber. The transfer chamber 130 and the load-lock chamber 120 are used to facilitate this operation.

Reference numerals 140a and 140b designate input/output valves (I/O valves) that are interposed between the transfer chamber 130 and the process chambers 110, and between the transfer chamber 130 and the load-lock chamber 120. In particular, the I/O valves 140a and 140b are each disposed in a respective wafer-transfer passage through which a wafer is transferred by a robot 132 when loaded/unloaded into or from a chamber. Reference numeral 124 designates a wafer cassette configured to support several units or dozens of units of wafers. A cassette elevator 122 is provided for lifting or lowering the cassette 124 to or from a predetermined position confronting the wafer-transfer passage extending from the load lock chamber 120. Reference numeral 134 designates a storage elevator for gradually lifting -or lowering a special cassette within the transfer chamber 130 to or from a predetermined position adjacent the same wafer-transfer passage.

Figure 3:
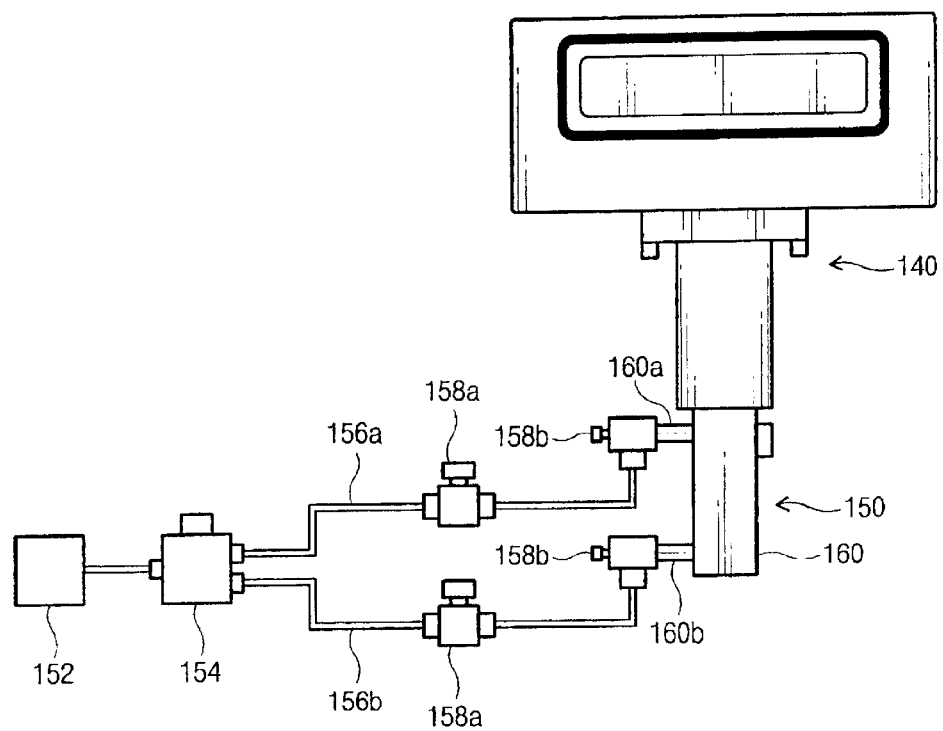
FIG. 3 is a schematic diagram of an input/output valve switching apparatus according to the present invention.

An input/output valve (I/O valve) 140, that is interposed between chambers of the semiconductor manufacturing system, is illustrated in more detail in FIG. 3. FIG. 3 also shows apparatus 150 for switching the I/O valve 140 between respective positions at which the valve 140 opens and closes the wafer-transfer passage between chambers. The switching apparatus 150 includes a source of compressed fluid 152 such as a compressor or a pump, a switching valve 154, a close fluid line 156a, an open fluid line 156b, first needle valves 158a, second needle valves 158b, and a double-acting cylinder 160. The fluid, used in the input/output valve switching apparatus, may be an air or an oil.

The double-acting cylinder 160 has a close port 160a and an open port 160b. The close fluid line 156a is coupled to the close port 160a, and the open fluid line 156b is coupled to the open port 160b.

The first and second needle valves 158a and 158b are installed in the fluid lines 156a and 156b. The first needle valve 158a controls a flow rate of fluid provided to the cylinder 160, and the second needle valve 158b controls the controlled flow rate of the fluid passing through the first needle valve 158a. That is, the first and second needle valves 158a and 158b serve as regulators to prevent fluid from being rapidly introduced into the cylinder 160. Preferably, the first and second needle valves 158a and 158b are manually adjustable. Accordingly, the speed at which the valve 140 is driven can be freely regulated.

More specifically, the switching apparatus 150 is configured to operate in general as follows. Fluid from the fluid pressure source 152 is directed to the close fluid line 156a or the open fluid line 156b by the switching valve 154. The fluid passes through the first and second needle valves 158a and 158b which regulate the flow rate thereof. Thereafter, the fluid is introduced into the ports 160a and 160b of the cylinder 160 to open/close the I/O valve 140.

When the valve 140 is to be opened, fluid from the fluid pressure source 152 is directed by the switching valve 154 through the open fluid line 156b whereupon the fluid encounters the first needle valve 158a. The first needle valve 158a restricts the diameter of the open fluid line 156b to regulate the flow rate of the fluid. The fluid, whose flow rate is controlled by the first needle valve 158a, then encounters the second needle valve 158b. There, the flow rate of the fluid is regulated one more time. As a result, the fluid is introduced at an optimal flow rate through the open port 160b of the cylinder 160, whereby the I/O valve 140 is opened smoothly. When the valve 140 is closed, an operation reverse to that described above is carried out, with the fluid being fed through the close fluid line 156a and into the cylinder 160 via the first and second needle valves 158a and 158b disposed in the close fluid line 156a.

That is, the flow rate of the fluid is regulated by the first and second needle valves 158a and 158b. Therefore, a rapid change in the pressure in the cylinder 160 is prevented to minimize the vibration that is set up when the fluid first enters or leaves the cylinder 160.

Additional advantages and modifications will readily occur to those skilled in the art. That is, the present invention is not limited to the specific details and representative embodiments shown and described herein. Rather, various modifications may be made to the disclosed invention without departing from the true spirit and scope thereof as defined by the appended claims.

What is claimed is:

1. An input/output valve (I/O valve) switching apparatus of a semiconductor manufacturing system, comprising:
    a fluid-driven actuator having a close port and an open port;
    a first fluid line connected to the close port;
    a second fluid line connected to the open port;
    first fluid flow regulators, disposed in said first and second fluid lines, respectively, for regulating the flow rate of fluid flowing to said ports of the actuator; and
    second fluid flow regulators, disposed in said first and second fluid lines between said first fluid flow regulators and said ports of the actuator, respectively, for regulating the flow rate of fluid passing through the first fluid flow regulators toward the actuator, wherein a rapid introduction of the fluid into the actuator can be prevented.

2. The switching apparatus as claimed in claim 1, wherein the first fluid flow regulator is a needle valve.

3. The switching apparatus as claimed in claim 1, wherein the second fluid flow regulator is a needle valve.

4. The switching apparatus as claimed in claim 2, wherein the needle valve is manually adjustable.

5. The switching apparatus as claimed in claim 3, where the needle valve is manually adjustable.

6. The switching apparatus as claimed in claim 1, wherein the actuator is a cylinder.

7. The switching apparatus as claimed in claim 6, wherein the cylinder is a double-acting cylinder.

8. The switching apparatus as claimed in claim 1, and further comprising a source of compressed fluid connected to said fluid lines, and wherein said actuator is a pneumatic actuator.

9. A semiconductor manufacturing system comprising:
    a plurality of vacuum chambers, at least two of said chambers being connected to one another by a wafer-transfer passage;
    an input/output valve disposed in said wafer-transfer passage and drivable between an open position at which said passage is open between said two connected chambers, and a closed position at which said valve blocks said passage;
    a fluid-driven actuator connected to said input/output valve and operable to drive said valve between said open and closed positions thereof, said fluid-driven actuator having a close port and an open port;
    a first fluid line connected to the close port;
    a second fluid line connected to the open port;
    first fluid flow regulators, disposed in said first and second fluid lines, respectively, for regulating the flow rate of fluid flowing to said ports of the actuator; and
    second fluid flow regulators, disposed in said first and second fluid lines between said first fluid flow regulators and said ports of the actuator, respectively, for regulating the flow rate of fluid passing through the first fluid flow regulators toward the actuator, wherein a rapid introduction of the fluid into the actuator can be prevented.

10. The semiconductor manufacturing system as claimed in claim 9, wherein the first fluid flow regulator is a needle valve.

11. The semiconductor manufacturing system as claimed in claim 9, wherein the second fluid flow regulator is a needle valve.

12. The semiconductor manufacturing system as claimed in claim 10, wherein the needle valve is manually adjustable.

13. The semiconductor manufacturing system as claimed in claim 11, wherein the needle valve is manually adjustable.

14. The semiconductor manufacturing system as claimed in claim 9, wherein the actuator is a cylinder.

15. The semiconductor manufacturing system as claimed in claim 14, wherein the cylinder is a double-acting cylinder.

16. The semiconductor manufacturing system as claimed in claim 9, and further comprising a source of compressed fluid connected to said fluid lines, and wherein said actuator is a pneumatic actuator.

17. The semiconductor manufacturing system as claimed in claim 9, wherein one of said two chambers is a process chamber in which a semiconductor wafer is processed.

* * * * *